United States Patent
Kolachina et al.

(10) Patent No.: US 6,911,832 B2
(45) Date of Patent: Jun. 28, 2005

(54) FOCUSED ION BEAM ENDPOINT DETECTION USING CHARGE PULSE DETECTION ELECTRONICS

(75) Inventors: Sivaramakrishna Kolachina, Sugarland, TX (US); Srikanth M. Perungulam, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/620,546

(22) Filed: Jul. 16, 2003

(65) Prior Publication Data

US 2005/0012512 A1 Jan. 20, 2005

(51) Int. Cl.$^7$ ............................................. G01R 31/305
(52) U.S. Cl. ................... 324/751; 250/309; 250/492.21
(58) Field of Search ....................... 324/71.3, 750–753, 324/158.1; 250/306, 309–311, 492.21

(56) References Cited

U.S. PATENT DOCUMENTS

| | | | | |
|---|---|---|---|---|
| 4,629,898 A | * | 12/1986 | Orloff et al. | 250/396 R |
| 5,140,164 A | * | 8/1992 | Talbot et al. | 250/492.2 |
| 5,541,411 A | * | 7/1996 | Lindquist et al. | 250/309 |
| 5,952,658 A | * | 9/1999 | Shimase et al. | 250/309 |

* cited by examiner

Primary Examiner—Minh N. Tang
(74) Attorney, Agent, or Firm—Peter K. McLarty; W. James Brady, III; Frederick J. Telecky, Jr.

(57) ABSTRACT

A system and method for detecting a milling endpoint on a semiconductor sample by directing an ion beam from a focused ion beam (FIB) apparatus at the sample and using charge pulse detection electronics (CPDE) components to generate a distribution curve on a histogram display. A preferred configuration of the CPDE components includes a charge preamplifier, a pulse amplifier, a pulse shaper, and a multichannel analyzer (MCA).

23 Claims, 5 Drawing Sheets

FOCUSED ION BEAM ENDPOINT DETECTION USING CHARGE PULSE DETECTION ELECTRONICS

BACKGROUND

Integrated circuits, comprised of numerous circuit elements, are typically fabricated in layers on the surface of a semiconductor wafer. Many fabrication processes are repeated numerous times, constructing layer after layer until fabrication is complete. Metal layers (which typically increase in number as device complexity increases) include patterns of conductive material that are insulated from one another vertically by alternating layers of insulating material. Vertical, conductive tunnels called "vias" typically pass through insulating layers to form conductive pathways between adjacent conductive patterns.

Periodically, an electrical malfunction or design flaw is found when an integrated circuit is electrically tested. Implementing a design change can be an extensive process. Typically, among other tasks, a circuit designer may have to produce new schematics, a vendor may need to supply new masks or other fabrication supplies, and wafer fab personnel may need to implement new process flows on various equipment sets. Rather than commencing a lengthy and costly redesign process only to have the new design fail in operation, it is often preferable to modify and test a physical sample of the integrated circuit prior to formalizing the modified design.

Integrated circuit failure analysis often involves the use of several different types of equipment, or tools. One of the most versatile failure analysis tools is the focused ion beam (FIB) apparatus, which can facilitate device modification. The FIB is a tool including one or more ion columns for generating ion beams. In general, the FIB is used for performing integrated circuit repair, editing, cross-sectioning, modifications to aid microprobing of the integrated circuit, and other common failure analysis applications. As an aside, it is noted that a device may need to be preprocessed before being operated on by the FIB tool. For example, a packaged device may need to be decapsulated, or "decapped," and an etching or grinding process for removing the encapsulant above the die may need to be performed prior to operations by the FIB tool.

Figure 1:
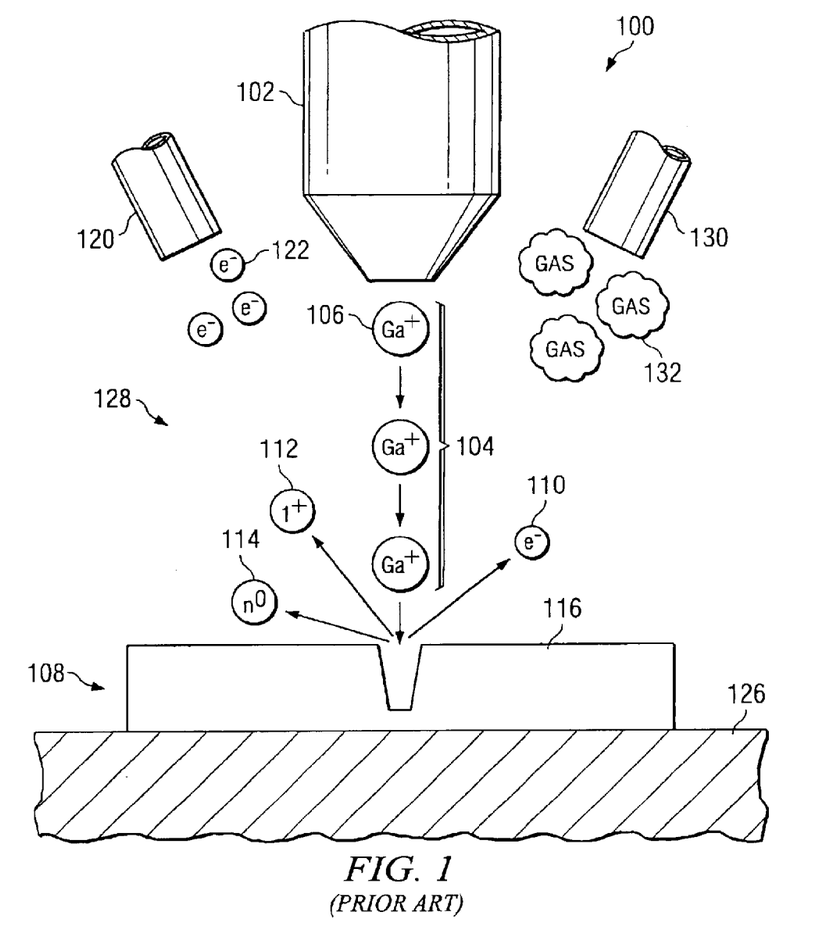
FIG. 1 shows a schematic of a typical focused ion beam (FIB) milling operation.

Referring now to FIG. 1, a side view is shown of an FIB apparatus 100 in operation. The centerpiece of a conventional FIB 100 is the primary ion column 102, which generates an ion beam 104 from a liquid metal ion source—typically gallium. Positively charged gallium ions (Ga$^+$) 106 are drawn off a field-emitter point source and accelerated by the application of a large potential, generally in the 30–50 kilovolt (kV) range. With the aid of electrostatic lenses, the emission is focused into a beam 104 typically having a sub-micron diameter. The ion beam 104 can be used to mill through a sample integrated circuit 108, as may be required in failure analysis. The sample 108 is usually positioned on a stage 126 inside a vacuum chamber 128.

Typically, secondary electrons 110, secondary ions (i$^+$ or i$^-$) 112, and neutral molecules and atoms 114 are ejected from the sample surface 116 when the ion beam 104 impacts the sample 108. The charged particles are drawn toward an electrically-biased grid and collected by a detector (not shown) generally positioned at an angle from the column 102. The signal from the ejected particles may be amplified and displayed to provide a real-time image of the area of interest.

Dual-column tools may have an ion column 102 complemented by an optional electron column 120, which is typically inclined 45–60 degrees from the ion column 102. The electron column 120 delivers a flood of electrons 122 to the local area and performs scanning electron microscope (SEM) imaging for the tool 100, providing an image generally superior to that formed by the ion column 102 alone. The electron column 120 may also aid in cross sectioning and transmission electron microscope (TEM) sample preparation, due to the ease of imaging the milling area.

The ion beam 104 is generally moved across the sample 108 in a single-direction raster or in a user-defined pattern. The operator has control over various parameters, such as beam current, spot size, pixel spacing, and dwell time. The dose, or amount of ions 106 striking the sample surface, is generally a function of the beam current, duration of scan, and the area scanned. The secondary yield, which is the number of ejected ions 112 per primary ion 106 directed at the sample, is a function of the material being milled. The amount of surface material of the sample 108 sputtered away by the ion beam 104 is a function of all the above-mentioned parameters.

While the ion beam 104 itself typically has a sputtering effect on the sample materials, there is often a need to add gases to assist in chemically removing material, thereby enhancing material removal process. Gas-assisted etching is a common feature in modern FIBs. An optional gas injection column 130 delivers a localized gas 132 to the area to be milled. This deposition gas 132 can interact with the primary ion beam 104 to provide selective gas-assisted chemical etching. Alternatively, the primary ion beam can be used to decompose the gas to provide selective deposition of conductive or insulating materials on the sample.

Semiconductor device modification can be facilitated by the FIB by directing the ion beam at a localized area of the modification to be performed. The ion beam removes material in the local area, milling through the various layers. When the layer of interest is reached, circuit edits can be performed by depositing a new metal line or other material in a desired location to establish a connection, or by cutting through an existing conductive line to sever a connection.

As a typical integrated circuit consists of alternating layers of conducting material and insulating dielectrics, with many layers containing patterned areas of both, the milling rate and effects of ion beam milling vary vastly across the device. In most device modification operations and several other FIB functions, it is preferable to stop the milling process as soon as a particular layer is exposed. Imprecise endpointing can greatly reduce the chances of success for a given device edit operation due to the potential of inadvertently creating either opens or shorts in the circuits.

Consequently, precise endpoint detection for the milling operation is desired. Determining an endpoint for the milling operation, or the instance at which the beam has reached the layer of interest, is becoming more difficult as devices grow in complexity and are designed with a greater number of layers. Endpoint detection is one of the most difficult tasks with which a failure analyst is faced.

Various methods exist for detecting FIB etch endpoints. Presently, the most common method is observation of the secondary electron yield, or the electrons ejected. The secondary yield is usually manifested as a contrast in the image formed from the secondary electrons (higher electron counts per unit time typically yield greater contrasts). As there is a significant difference in the electron yield between conductors, such as copper and aluminum relative to dielectrics, the endpoint of a certain milling/etching operation can be determined from observing the resulting live image. An offshoot technique is monitoring the secondary ion yield, or the ions ejected. The aforementioned methods may be suitable for surface milling, but on advanced integrated circuits with several metal layers, the relatively high aspect ratios of the complex edits can make it very difficult to obtain sufficient image contrast for precise endpoint detection.

On some FIBs, end-point detection is performed through the addition of an Auger, SIMS (Secondary Ion Mass Spectroscopy), or EDX (Energy Dispersive X-ray) detector to monitor material changes. This practice generally necessitates the use of another port on the FIB for each of these detectors. As ports are generally limited on FIBs and may be needed for other operations, port availability can often be an issue. End-point determination can also be performed by monitoring the substrate current as a function of the milling process. When milling silicon wafers with an FIB, the wafer backside is generally grounded to a stage within the apparatus, so measuring the current passing through the stage can generally give an accurate representation of the substrate current. When the ion beam impacts the surface of the device, a charge build-up occurs when dielectric materials are struck. When the milling reaches a conductive material, the charge is largely dissipated through the substrate. By monitoring the current through the substrate, one can determine if a conductive material has been reached. Alternatively, with packaged devices, the leads on the chip may be shorted to the stage and the total lead current is thus monitored.

Yet another end point determination method involves using a voltage contrast feature of FIBs to identify active conductors. Applying a voltage to the conductive layer of interest greatly impacts the secondary yield, and thereby changes the image contrast. The secondary emission characteristics for a conductor tied to ground vary significantly when compared to a conductor at a different potential. This variation produces a passive voltage contrast in the image. Active voltage contrast can be obtained by toggling the voltage on the conductor of interest. When modifying a packaged device, the voltages may be applied via an external package lead that is interconnected with the layer of interest. However, provide a wired connection can be a difficult task to achieve when modifying a wafer, i.e., a device that is not packaged. Applying a voltage directly to the layer of interest within a wafer is much more complicated.

Recently, there have been inventions and papers discussing the automation of the endpointing technique to stop the edit process at the desired level. Despite recent advancements, endpoint detection is still one of the most difficult steps in device modification and is often the reason for failures in the FIB edit and modification process. As devices continue to increase in complexity and number of layers, successful endpoint detection will become even more difficult to achieve. A more precise method of endpoint detection is therefore desired.

BRIEF SUMMARY

The problems noted above are solved in large part by a system and method for determining the endpoint for a focused ion beam (FIB) milling process on an integrated circuit semiconductor sample. The preferred embodiments of the present invention involve using charge pulse detection electronics (CPDE) to monitor the ion-beam-induced current generated while milling a semiconductor sample with a focused ion beam (FIB) apparatus. When an ion from the beam strikes the semiconductor sample, a current transient is generated and fed to the CPDE, which produces a distribution curve on a histogram display as output. The shift in the distribution curve as milling progresses enables close monitoring of the milling process and gives an indication of proximity to the endpoint of the mill. A preferred configuration of the CPDE components includes a charge preamplifier, a pulse amplifier, a pulse shaper, and a multi-channel analyzer (MCA).

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. Also, the term "couple" or "couples" is intended to mean either a direct or indirect electrical or wireless connection. The phrase "directly coupled" is intended to mean a direct physical and/or electrical connection with no electrical devices connected interstitially between the two coupled devices. To the extent that any term is not specially defined in this specification, the intent is that the term is to be given its plain and ordinary meaning.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 2:
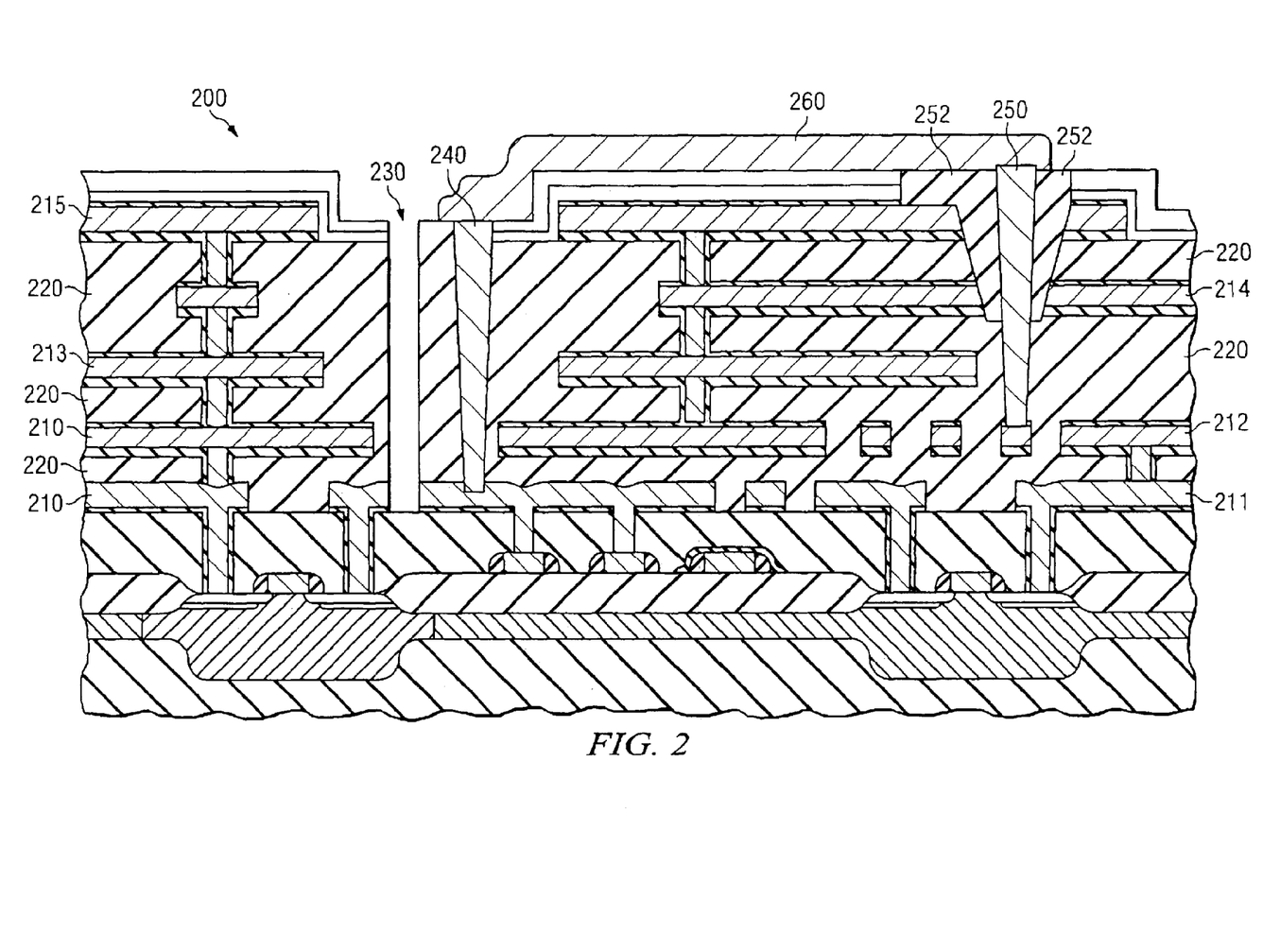
FIG. 2 shows a cross-sectional view of a typical integrated circuit with FIB device modifications.

Disclosed herein is a method for endpoint detection that may used when milling with a focused ion beam (FIB). FIG. 2 shows a cross-sectional view of typical integrated circuit sample 200 with exemplary device modifications formed by an FIB. Integrated circuit 200 includes several metal layers 210, which are conventionally labeled MTn, where n is a layer number commonly designating fabrication order. Thus, the metal layers 210 include layers that are individually denoted as MT1 211, MT2 212, MT3 213, MT4 214; and MT5 215. Dielectric material 220 insulates the metal layers from one another.

Sample 200 is shown having a high-aspect-ratio hole 230 milled down to MT1 211. A via 240 down to MT1 211 may be formed by milling a similar hole, then filling the hole with conductive material, such as tungsten (W). An insulated via 250 may be formed by first milling a hole through MT5 215 and MT4 214. The milled area may then be filled with an FIB-deposited insulator 252, such as silicon dioxide. Next the FIB may mill through insulator 252 down to MT2 212, and finally the hole may be filled with a conducting material such as tungsten to form the via 250. A strap, or "stitch" 260, may then be deposited between vias 240 and 250, electrically connecting the two vias, and thereby connecting conductive traces in layers MT1 211 and MT2 212, respectively.

Since milling operations may involve tunneling through sub-micron-thick layers, stopping at an exact depth is very important. However, this can be difficult without precise endpoint detection. Poor endpoint detection could result in milling a hole that is too deep, potentially severing a metal layer below the intended endpoint and leading to open circuits or other failures. In addition, creating a conductive via of excessive depth could inadvertently short the via to a metal layer below the intended endpoint. Conversely, milling a hole that is not deep enough may not fully sever a metal line as intended, or may not contact the metal line at all. Precise endpoint detection prior to creating new conductive stitches is important, to ensure that the proper metal layers are milled through to, such that vias can properly contact the respective metal layers.

Figure 3:
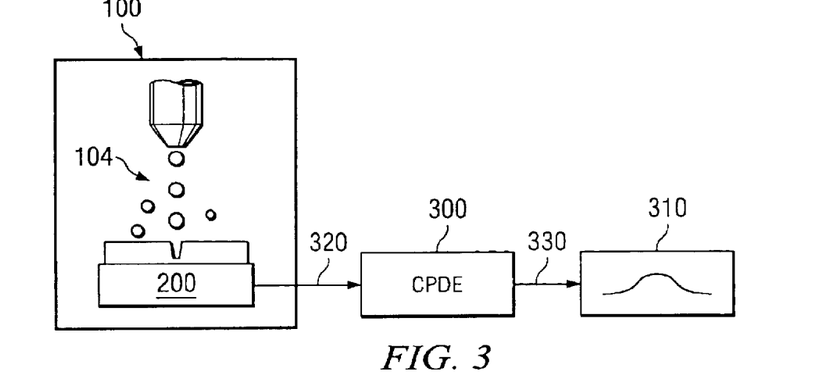
FIG. 3 shows a schematic of a semiconductor sample undergoing FIB milling and connected to a CPDE apparatus and the output of the CPDE displayed as a histogram.

In a preferred embodiment of the present invention, FIG. 3 shows charge pulse detection electronics (CPDE) 300 connected to a semiconductor sample 200 in a FIB 100. The FIB 100 produces an ion beam 104 that is incident on the semiconductor sample 200. The sample 200 is electrically insulated from the electrical ground of the FIB 100. Any part of the sample 200 (e.g., the silicon substrate, a surface bond pad, or a metal layer) may be connected to the input 320 of CPDE 300.

As ions from ion beam 104 impact sample 200, the collisions each dislodge a number of electrons from the impacted material, causing a "charge pulse" that can be detected as a pulse in current or voltage. The charge pulses vary in size, based on a number of factors including ion energy and surface material. The CPDE detects these pulses and categorizes them based on pulse height or pulse energy to provide pulse distribution output 330, which may be displayed as a histogram 310.

Figure 4:
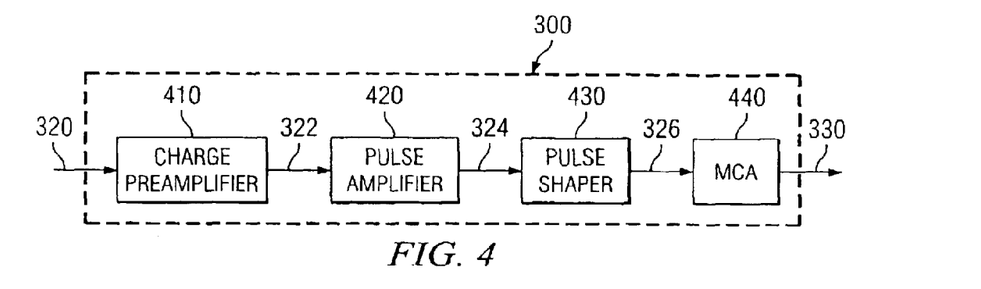
FIG. 4 shows a schematic of a preferred embodiment of a CPDE.

A preferred configuration of components for performing CPDE endpoint detection is shown in FIG. 4. A preferred embodiment of the CPDE 300 includes a charge preamplifier 410, a pulse amplifier 420, a pulse shaper 430, and a multi-channel analyzer (MCA) 440, connected in the order shown.

The sample (not shown in FIG. 4) is coupled directly to the charge preamplifier 410. When ions from the milling ion beam 104 strikes the sample, a sequence of current transients 320 may be generated and fed into the charge preamplifier 410. Each current transient 320 is amplified and integrated to produce a voltage pulse indicative of the size of the original charge pulse. These voltage pulses appear on output 322 and are fed to the pulse amplifier 420. The preamplifier 410 is preferably located as closely as possible to the sample 200 to maximize the signal to noise ratio of the signal 320. The pulse amplifier 420 may be located in a more convenient location and coupled to the preamplifier 410 by a coaxial cable.

The pulse amplifier 420 provides impedance matching to any cabling between the preamplifier 410 and pulse amplifier 420, and may further provide additional amplification if desired to simplify downstream circuits. The output 324 from pulse amplifier 420 may be fed to a pulse shaper 430 that filters the pulses to optimize their shape for a size or energy measurement. The output 326 of the pulse shaper 430 may be a series of shaped pulses, each having a height proportional to the charge measured by the charge preamplifier 410.

The output pulses of the pulse shaper 430 may be fed to a multi-channel analyzer (MCA) 440 that detects the pulse heights and categorizes the pulses into "channels" based on their heights. The number of pulses in each category (or channel) may be counted to provide a pulse distribution output 330. Each category, or "channel," is associated with a range of pulse heights, and may be numbered with the category number increasing as the range of pulse height increases.

It will be understood that the order of the constituent components within CPDE 300 may vary according to equipment configurations offered by commercial manufacturers of the components. In an alternative embodiment, the pulse amplifier 420 and pulse shaper 430 may be reversed in order, such that the charge preamplifier 410 is directly coupled to the pulse shaper 430.

Figure 5:
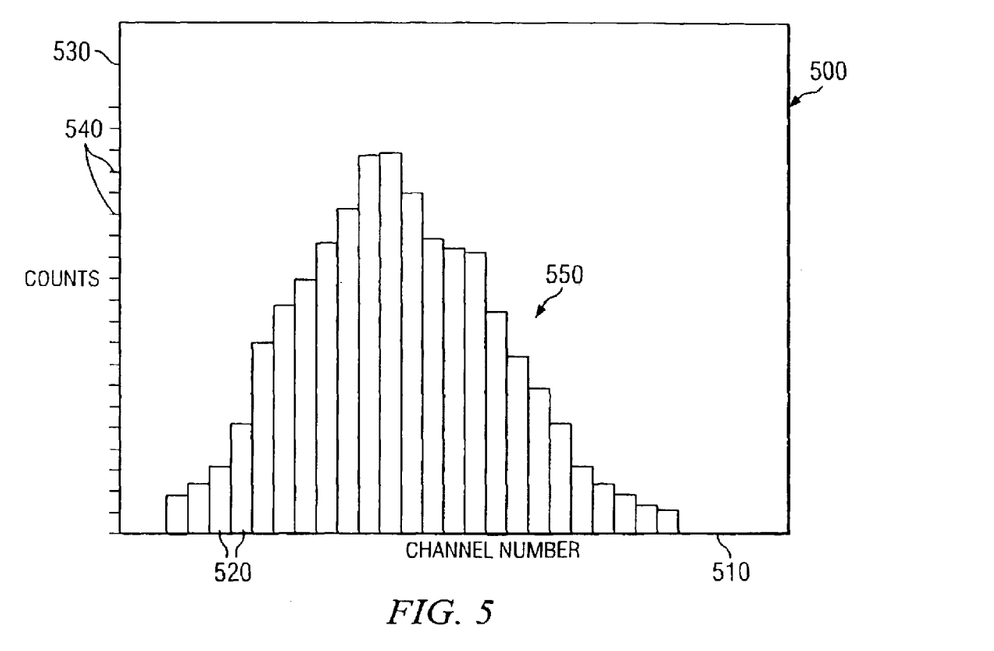
FIG. 5 shows an exemplary output histogram.

Referring now to FIG. 5, each detected ion strike on the sample results in a single event being recorded in a histogram 500. The X-axis 510 of histogram 500 represents the various channel numbers 520, and the Y-axis 530 represents the event count 540. A distribution curve 550 is created by sorting the individual events into the appropriate channels 520. The shape of the distribution curve 550 represents variation in the charge collected for a certain number of ions hitting the sample. The shape of the distribution is also a function of the material being struck by the ions, its geometrical configuration with respect to the substrate, layer, or conductors to which CPDE 300 is connected, and the milling rate. A narrower and taller distribution shape may represent ions striking the sample in the immediate vicinity of the layer of interest, as there would be less ion deflection and therefore, less deviation reflected in the distribution.

In the resulting histogram 500, an increasing channel number 520 represents increasing charge pulse height, which implies increased charge collected by the charge preamplifier. In cases where the CPDE 300 is connected to a layer adjacent the layer being milled, as the milling progresses, an increase in the charge collected by the charge preamplifier indicates more proximate removal of material through milling. Consequently, a greater proximity of the ion beam to the desired endpoint of milling may be indicated. Since the histogram can be monitored ion by ion, the ion incidence rate (beam current) can be controlled to accurately stop milling at the desired endpoint.

Figure 6:
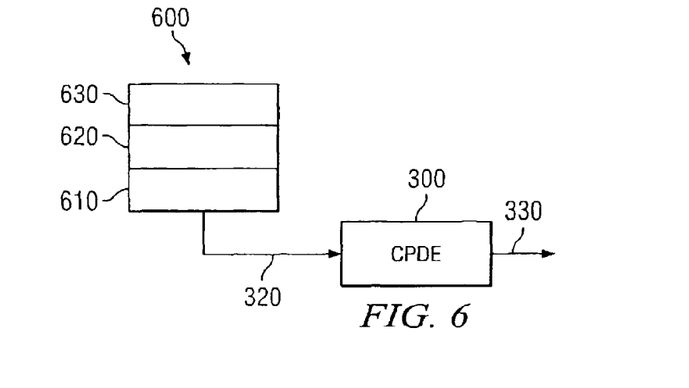
FIG. 6 shows an exemplary configuration of a semiconductor device connected to a CPDE.

FIG. 6 shows a simplified structure of a semiconductor sample 600 with three layers of interest 610, 620 and 630, respectively, targeted for removal by an FIB. As is a typical with semiconductor devices, it is assumed that the adjacent layers are largely dissimilar in material composition. For the embodiment shown, layer 610 is connected to the CPDE 300 by a conductive cable or other electrically conductive link. In a packaged device, a probe needle may be used to probe a pin connected to the layer of interest after first decapping the package. As layer 630 is being milled, ion charge is deposited into the sample 600, resulting in a current transient on input 320 to the CPDE 300. As more material from layer 630 is removed by the ion beam 12, the amount of charge in the current transients increases. Consequently, the pulse distribution curve shifts to the higher channel numbers.

Figure 7A:
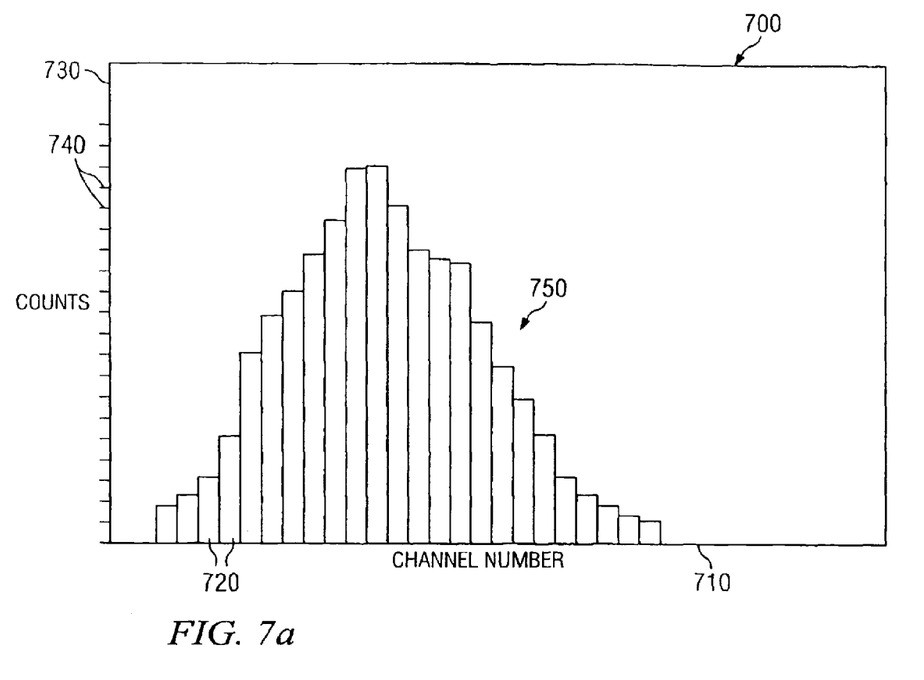
FIG. 7a shows an exemplary output histogram representing milling of a first layer of the device.
Figure 7B:
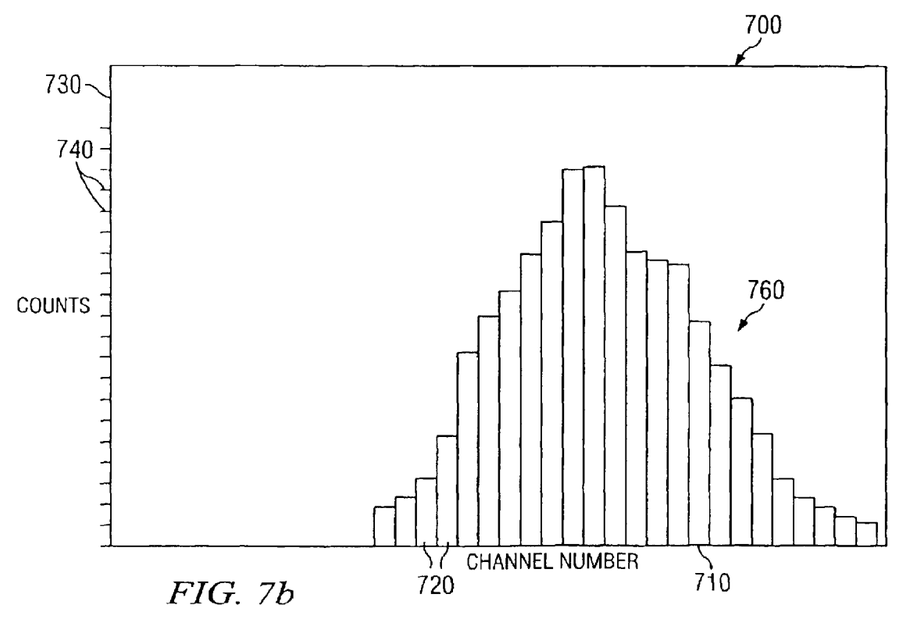
FIG. 7b shows an exemplary output histogram representing milling of a second layer of the device

Referring now to FIGS. 7a and 7b, exemplary histograms are shown as resulting from milling operations of the sample 600 of FIG. 6. FIG. 7a shows an exemplary histogram display 700 including an X-axis 710 representing the channel number 720, and a Y-axis 730 representing the event count 740. A distribution curve 750 is formed after the ion beam has milled through the layer 630 and reached layer 620, as shown in FIG. 6. The number of each channel 720 is proportional to the charge collected by the charge preamplifier 410 as each ion from the FIB struck the sample.

FIG. 7b shows a histogram display 700 having a distribution curve 760 formed as the ion beam milled the layer 620 and reached layer 610, as shown in FIG. 6. Compared with distribution curve 750 in FIG. 7a, the distribution 760 in FIG. 7b is shifted right along X-axis 710, towards the higher channel numbers 720, as a greater amount of charge reaches layer 610 due to the removal of layer 620. As the milling of layer 620 progresses, the event counts 740 at the higher channel numbers 720 increases, slowly shifting the events recorded to the right, forming distribution 760. Since the X-axis of the histogram represents the channels in increasing order, as the milling progresses, newer counts will be registered in the higher channels of the histogram. An operator can monitor the recording of events in the histogram such that material removal and the desired endpoint can be accurately tracked.

Events are typically counted real-time on a histogram, with the events dynamically tallied to form columns of assorted heights within various channels. If the histogram display were permitted to record every event detected from the start of milling the sample to an endpoint several layers deep into the sample, a likely result would be a display showing event counts in a wide range of channel numbers. Instead of one distribution curve, there would likely be several peaks, increasing in height towards the right of the graph, with each peak representing a successive layer. Accordingly, it may be preferred to periodically reset the histogram counts to zero and restart the counting. This is herein called "refreshing" the histogram. Setting a reasonable refresh rate for the histogram display will allow enough data to be recorded and displayed to form an identifiable distribution, but not so much as to obscure shifting of the distribution.

If distribution shifts rapidly, the operator can reduce the incident ion beam current to slow down and more tightly control the milling process. This will ensure that the operator has good control of the milling process and has the ability to stop the milling at the desired endpoint depth. This level of process control is very valuable when the thickness of the respective layers are measured on a sub-micron scale, as is the case in most advanced integrated circuits. For effective utilization of the endpoint detection method of the preferred embodiments, the operator should preferably characterize the milling process using a reference sample. Example histograms can be obtained by milling this reference sample, such that representative curve shapes are obtained for each layer. Once a calibration is performed, changes in the histogram should provide valuable clues about the milling rates and proximity to the desired endpoints. When compared with representative curve shapes, the curves formed on the histogram display can indicate when a milling endpoint is being reached on a specific layer within the sample.

It will be understood that the preferred configuration is to electrically connect the layer of interest, which will serve as the intended endpoint, to the CPDE. However, in scenarios where this is not feasible, a connection to the CPDE can be made from the silicon substrate. Pulses detected by a connection to a layer beneath the layer of interest will likely not register as large in magnitude as those obtained by connecting directly to the layer of interest, but proper calibration can facilitate accurate endpoint detection. The distribution of the histograms and the variations in the distributions with milling can vary between different types of samples and different configurations of connections made to the CPDE.

Figure 8:
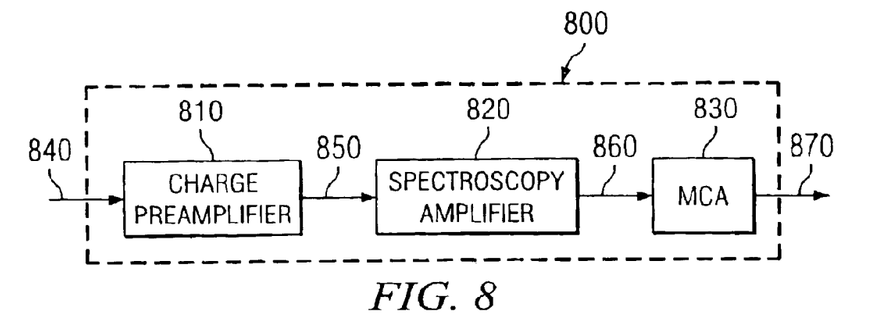
FIG. 8 shows a schematic of an alternative embodiment of a CPDE.

In an alternative embodiment, the pulse amplifier and pulse shaper may be a single, combined component, rather than two discrete components. Referring now to FIG. 8, the CPDE 800 consists of a charge preamplifier 810, a spectroscopy amplifier 820 and a multi-channel analyzer (MCA) 830. The spectroscopy amplifier 820 may include components that act as integrators, pulse shapers and amplifiers. Amplification may actually be a relatively minor role of a spectroscopy amplifier, which might be best described as a signal processor. The major role of an amplifier is to convert the preamplifier output signal into a form most suitable for the measurement desired.

The charge preamplifier 810 produces an output voltage pulse 850 proportional to the input charge 840. The output 850 of the charge preamplifier 810 is fed to the spectroscopy amplifier 820, which shapes the pulse and amplifies it further. The output of the spectroscopy amplifier 820 is a pulse 860, the height of which is proportional to the charge measured by the charge preamplifier 810. The output pulse 860 of the spectroscopy amplifier 820 is fed to an MCA 830, which sorts the pulses 860 based on their heights and assigns the sorted output 870 to various channels. The MCA 836 may be a stand-alone instrument or integrated into other instruments, such as a personal computer.

Figure 9:
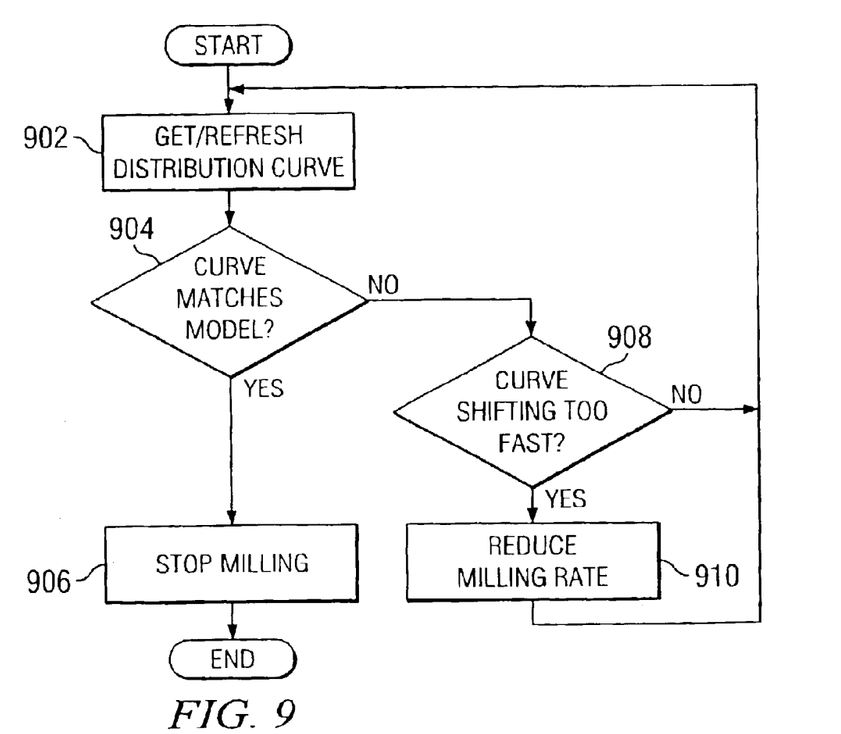
FIG. 9 shows a flowchart of end-point detection operations using CPDE electronics.

Referring now to FIG. 9, a flowchart of end-point detection operations using CPDE electronics is shown. In block 902, a distribution curve formed from plotted events is obtained on a histogram display. In block 904, the distribution curve is compared with a model distribution curve, the shape and size of which have been predetermined to correlate with a curve obtained by milling a particular layer. If the distribution curve obtained by milling the sample does not match the model, an operator will determine if the curve is shifting too fast as shown in block 908. A rapidly shifting curve could signify that milling has completed on a particular layer and that the milling end-point has reached the interface between two sample layers. The rapid shift would indicate that new events are being recorded on the histogram for a subsequent layer. If the curve is shifting rapidly, the operator can reduce the milling rate, as in block 910. If the curve is not shifting rapidly, the operator can repeat the curve monitoring process by reviewing or refreshing the histogram display, as shown in block 902.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A semiconductor milling endpoint detection system comprising:
    a focused ion beam (FIB) apparatus for directing a focused ion beam at an integrated circuit sample, wherein a charge pulse is generated each time an ion from the beam strikes the sample;
    a plurality of charge pulse detection electronics (CPDE) components, wherein the CPDE components are coupled to the sample; and
    a histogram display.

2. The endpoint detection system of claim 1, wherein the CPDE components comprise:
    a charge preamplifier directly coupled to a layer of interest within the sample and configured to amplify and integrate the charge pulse to produce a voltage pulse indicative of the size of the charge pulse;
    a pulse amplifier directly coupled to the charge preamplifier and configured to amplify the voltage pulse;
    a pulse shaper directly coupled to the pulse amplifier and configured to optimize the shape of the voltage pulse to a height proportional to the charge pulse; and
    a multi-channel analyzer (MCA) directly coupled to the pulse shaper and configured to detect the height of the shaped pulse and sort the shaped pulse into one of a plurality of channels, wherein each channel is associated with a range of shaped pulse heights.

3. The endpoint detection system of claim 1, wherein the histogram display comprises:
    an X-axis divided into a plurality of channels;
    a Y-axis representing an event count, wherein the event count is generated each time an ion strikes the sample;
    a distribution curve, wherein the curve is formed by plotting the event count into an appropriate channel based on a height of each shaped pulse.

4. The endpoint detection system of claim 3, wherein the system is calibrated by milling a reference sample similar in construction to the integrated circuit sample and obtaining a reference curve for each layer within the reference sample.

5. The endpoint detection system of claim 4, wherein a noticeable shift in the distribution curve indicates that milling has completed on a layer within the integrated circuit sample.

6. The endpoint detection system of claim 5, wherein a milling endpoint is detected by comparing the distribution curve formed immediately prior to the shift with the reference curves.

7. The endpoint detection system of claim 3, wherein the histogram display is refreshed on command.

8. The endpoint detection system of claim 1, wherein the CPDE components comprise:
    a charge preamplifier, wherein the charge preamplifier is directly coupled to a layer of interest within the sample;
    a pulse shaper directly coupled to the charge preamplifier;
    a pulse amplifier directly coupled to the pulse shaper; and
    a multi-channel analyzer (MCA) directly coupled to the pulse amplifier.

9. The endpoint detection system of claim 1, wherein the CPDE components comprise:
    a charge preamplifier is directly coupled to a layer of interest within the sample;
    a spectroscopy amplifier directly coupled to the charge preamplifier; and
    a multi-channel analyzer (MCA) directly coupled to the spectroscopy amplifier.

10. A method for detecting a focused ion beam milling endpoint on a semiconductor comprising:
    striking an integrated circuit sample with an ion beam generated by a focused ion beam (FIB) apparatus;
    utilizing a plurality of charge pulse detection electronics (CPDE) components to detect and configure a charge pulse generated each time an ion from the beam strikes the integrated circuit sample; and
    creating a distribution curve on a histogram display based on output of the CPDE components.

11. The method of claim 10, wherein the CPDE components comprise:
    a charge preamplifier directly coupled to a layer of interest within the sample and configured to amplify and integrate the charge pulse to produce a voltage pulse indicative of the size of the charge pulse;
    a pulse amplifier directly coupled to the charge preamplifier and configured to amplify the voltage pulse;
    a pulse shaper directly coupled to the pulse amplifier and configured to optimize the shape of the voltage pulse to a height proportional to the charge pulse; and
    a multi-channel analyzer (MCA) directly coupled to the pulse shaper and configured to detect the height of the shaped pulse and sort the shaped pulse into one of a plurality of channels, wherein each channel is associated with a range of shaped pulse heights.

12. The method of claim 10, wherein the histogram display comprises:
    an X-axis divided into a plurality of channels;
    a Y-axis representing an event count, wherein the event count is generated each time an ion strikes the sample;
    a distribution curve, wherein the curve is formed by plotting the event count into an appropriate channel based on a height of each shaped pulse.

13. The method of claim 12, wherein the histogram display is calibrated by milling a reference sample similar in construction to the integrated circuit sample and obtaining a reference curve for each layer within the reference sample.

14. The method of claim 13, wherein a noticeable shift in the distribution curve indicates that milling has completed on a layer within the integrated circuit sample.

15. The method of claim 14, wherein a milling endpoint is detected by comparing the distribution curve formed immediately prior to the shift with the reference curves.

16. The method of claim 12, wherein the histogram display is refreshed on command.

17. The method of claim 10, wherein the CPDE components comprise:
    a charge preamplifier, wherein the charge preamplifier is directly coupled to a layer of interest within the sample;
    a pulse shaper directly coupled to the charge preamplifier;
    a pulse amplifier directly coupled to the pulse shaper; and a multi-channel analyzer (MCA) directly coupled to the pulse amplifier.

18. The method of claim 10, wherein the CPDE components comprise:

a charge preamplifier is directly coupled to a layer of interest within the sample;

a spectroscopy amplifier directly coupled to the charge preamplifier; and a multi-channel analyzer (MCA) directly coupled to the spectroscopy amplifier.

19. An integrated circuit sample milled according to a process comprising the steps of:

striking the sample with an ion beam generated by a focused ion beam (FIB) apparatus;

detecting and configuring a charge pulse generated each time an ion from the beam strikes the sample with a plurality of charge pulse detection electronics (CPDE) components; and generating a distribution curve on a histogram display based on output of the CPDE components.

20. The sample of claim 19, wherein the CPDE components comprise:

a charge preamplifier directly coupled to a layer of interest within the sample and configured to amplify and integrate the charge pulse to produce a voltage pulse indicative of the size of the charge pulse;

a pulse amplifier directly coupled to the charge preamplifier and configured to amplify the voltage pulse;

a pulse shaper directly coupled to the pulse amplifier and configured to optimize the shape of the voltage pulse to a height proportional to the charge pulse; and a multi-channel analyzer (MCA) directly coupled to the pulse shaper and configured to detect the height of the shaped pulse and sort the shaped pulse into one of a plurality of channels, wherein each channel is associated with a range of shaped pulse heights.

21. The sample of claim 19, wherein the histogram display comprises:

an X-axis divided into a plurality of channels;

a Y-axis representing an event count, wherein the event count is generated each time an ion strikes the sample;

a distribution curve, wherein the curve is formed by plotting the event count into an appropriate channel based on a height of each shaped pulse.

22. The sample of claim 21, wherein a noticeable shift in the distribution curve indicates that milling has completed on a layer within the sample.

23. The sample of claim 22, wherein a milling endpoint is detected by comparing the distribution curve formed immediately prior to the shift with the reference curves.

* * * * *